(12) United States Patent
Tammineedi

(10) Patent No.: US 6,980,145 B1
(45) Date of Patent: Dec. 27, 2005

(54) SYSTEM AND METHOD FOR NOISE CANCELLATION IN A SIGNAL PROCESSING CIRCUIT

(75) Inventor: Anil Tammineedi, Cerritos, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/903,556

(22) Filed: Jul. 30, 2004

(51) Int. Cl.⁷ .............................................. H03M 3/00
(52) U.S. Cl. ..................... 341/143; 341/131; 341/144; 341/155
(58) Field of Search ........................ 341/131, 143–144, 341/155

(56) References Cited

U.S. PATENT DOCUMENTS

| | | | | |
|---|---|---|---|---|
| 4,710,747 A | * | 12/1987 | Holland ...................... | 341/120 |
| 4,751,496 A | * | 6/1988 | Araki et al. ................. | 341/131 |
| 4,831,464 A | * | 5/1989 | Chijiiwa ...................... | 360/32 |
| 4,968,987 A | * | 11/1990 | Naka et al. .................. | 341/143 |
| 5,144,308 A | * | 9/1992 | Norsworthy ................ | 341/131 |
| 5,416,481 A | * | 5/1995 | Chen .......................... | 341/131 |
| 5,525,984 A | * | 6/1996 | Bunker ....................... | 341/131 |
| 6,016,113 A | * | 1/2000 | Binder ........................ | 341/131 |
| 6,064,328 A | * | 5/2000 | Scheidig et al. ............ | 341/131 |
| 6,147,633 A | * | 11/2000 | Ukawa et al. .............. | 341/143 |
| 6,175,321 B1 | * | 1/2001 | Frannhagen et al. ........ | 341/143 |
| 6,268,814 B1 | * | 7/2001 | Kolsrud ....................... | 341/131 |
| 6,326,911 B1 | * | 12/2001 | Gomez et al. .............. | 341/143 |
| 6,577,257 B2 | * | 6/2003 | Brooks ........................ | 341/131 |
| 6,710,729 B1 | * | 3/2004 | Chen ........................... | 341/143 |

* cited by examiner

*Primary Examiner*—Peguy JeanPierre
*Assistant Examiner*—Khai M. Nguyen
(74) *Attorney, Agent, or Firm*—McAndrews, Held & Malloy, Ltd.

(57) ABSTRACT

A system and method for noise cancellation in a signal-processing circuit (e.g., an analog-to-digital converter circuit). Various aspects of the present invention may comprise inputting a first input signal and a digital input signal to the signal-processing circuit. The digital input signal may, for example, comprise a digital dither signal or other processor control signal. The signal-processing circuit may, for example, output a signal comprising a first signal component that is primarily a function of the first input signal and a second signal component that is primarily a function of the digital input signal. The second signal component may be estimated based on estimated behavior of the signal-processing circuit in response to the digital input signal. The estimated second signal component may, for example, be substantially removed from the signal-processing circuit output signal.

26 Claims, 4 Drawing Sheets

SYSTEM AND METHOD FOR NOISE CANCELLATION IN A SIGNAL PROCESSING CIRCUIT

CROSS-REFERENCE TO RELATED APPLICATIONS/INCORPORATION BY REFERENCE

Not Applicable

FEDERALLY SPONSORED RESEARCH OR DEVELOPMENT

Not Applicable

SEQUENCE LISTING

Not Applicable

MICROFICHE/COPYRIGHT REFERENCE

Not Applicable

BACKGROUND OF THE INVENTION

Signal-processing circuits, such as analog-to-digital converter circuits, may under particular circumstances, exhibit tonal behavior. That is, the signal-processing circuits may generate tones, which may be undesirable for an intended application. For example, a delta-sigma modulator circuit may, in certain circumstances, output quantization noise, including idle-channel noise. Also for example, a delta-sigma modulator circuit may, in certain circumstances, exhibit periodic (e.g., tonal) behavior. Even in circumstances where such noise is not directly perceivable by a user, such noise may adversely affect circuit performance.

Various attempts have been made to reduce tonal behavior in signal-processing circuits. For example, in various analog-to-digital converter circuits, attempts have been made to introduce a random signal into the circuit to disrupt periodic circuit behavior. An example of this may be found in "Delta-Sigma Data Converters, Theory Design and Simulation," by Norsworthy et al., and published by IEEE Press, which shows introducing a random analog signal into a delta-sigma modulator circuit.

Introducing such a random analog signal into a circuit may not be an optimal solution, depending, for example, on the particular circuit and practical circuit design considerations. Accordingly, attempts have been made to introduce a random digital signal into a circuit to disrupt periodic circuit behavior. An example of this may be found in U.S. Pat. No. 6,577,257 to Brooks, the content of which is hereby incorporated herein by reference in its entirety. The U.S. Pat. No. 6,577,257 shows a system and method for introducing a digital dither signal into a delta-sigma modulator circuit to disrupt periodic behavior.

Introducing a digital signal (e.g., a digital dither signal) into a signal-processing circuit to disrupt periodic behavior or to control other noise-producing aspects of a signal-processing circuit may result in decreased circuit performance and undesirable components in an output signal of the signal-processing circuit. That is, introducing such a digital signal into a signal-processing circuit may solve one problem while creating others.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Various aspects of the present invention provide a system and method for noise cancellation in a signal-processing circuit. Such a signal-processing circuit may, for example, comprise an analog-to-digital converter circuit or other signal-processing circuit.

Various aspects of the present invention may comprise inputting a first input signal and a digital input signal to the signal-processing circuit. The digital input signal may, for example, comprise a signal-processing control signal. Such a signal-processing control signal may, for example and without limitation, comprise a digital dither signal or other digital signal that controls an aspect of the signal-processing circuit behavior.

The signal-processing circuit may, for example, generate a multi-component signal comprising a first signal component and a second signal component. The first signal component may, for example, be primarily due to the signal-processing circuit processing the first input signal. The second signal component may, for example, be primarily due to the signal-processing circuit processing the digital input signal. The generated signal may also comprise other signal components.

The second signal component may, for example, be estimated based on estimated or known behavior of the signal-processing circuit in response to the digital input signal. For example, the signal-processing circuit may generally process the digital input signal according to a known or estimated transfer function. The second signal component may, for example, be estimated by applying the digital input signal to the known or estimated transfer function.

The estimated second signal component may be subtracted, or otherwise removed, from the multi-component signal generated by the signal-processing circuit to yield an output signal from which the second signal component has been substantially removed.

These and other advantages, aspects and novel features of the present invention, as well as details of illustrative aspects thereof, will be more fully understood from the following description and drawings.

DETAILED DESCRIPTION OF THE INVENTION

Figure 1:
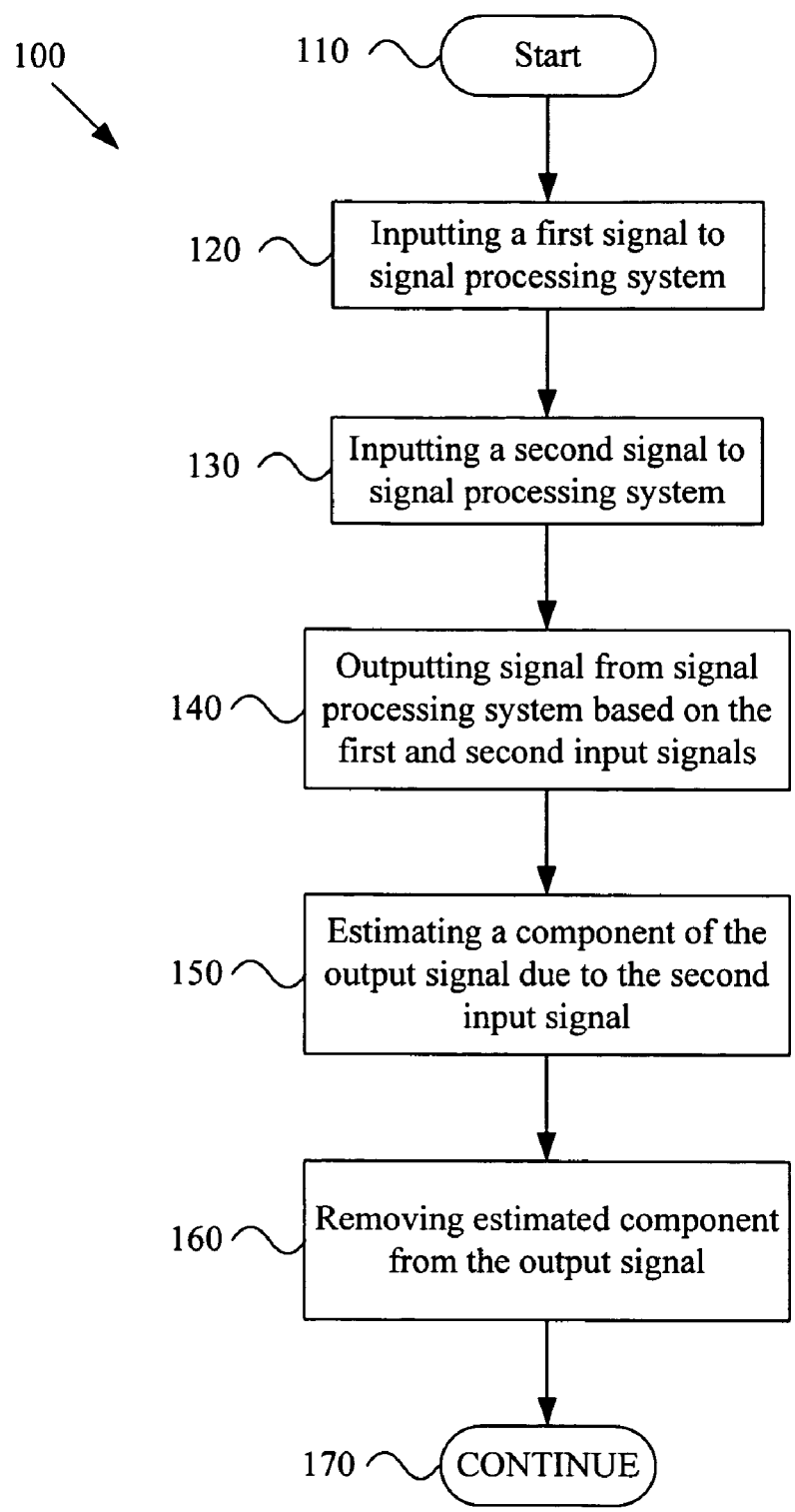
FIG. 1 is a flow diagram illustrating a method for noise cancellation in a signal-processing system, in accordance with various aspects of the present invention.

FIG. 1 is a flow diagram illustrating a method 100 for noise cancellation in a signal-processing system, in accordance with various aspects of the present invention. The signal-processing system may, for example, comprise any of a large variety of signal-processing systems. For example, the signal-processing system may comprise various audio, video and data processing systems. For example, the signal-processing system may comprise an analog-to-digital circuit (e.g., a delta-sigma modulator circuit).

Various aspects of the method 100 may be described below using an exemplary signal-processing scenario comprising an analog-to-digital converter. Such an exemplary signal-processing scenario or signal-processing system configuration are offered herein for illustrative purposes only (i.e., for providing a specific example of broader aspects). Accordingly, the scope of various aspects of the present invention should by no means be limited by characteristics of any exemplary system or scenario described herein, including those involving analog-to-digital converter circuitry.

The method 100 begins at step 110. The method 100 may be initiated by any of a large number of triggering events. For example, the method 100 may execute whenever power and/or a signal is applied to a circuit implementing the method 100. Also, for example, the method 100 may execute automatically in response to a particular detected noise situation. Additionally, for example, the method 100 may execute in response to an operator command. Accordingly, the scope of various aspects of the present invention should not be limited by characteristics of particular initiating conditions or circumstances.

The method, at step 120, may comprise inputting a first signal to the signal-processing system. The first signal may, for example, be analog or digital. In an exemplary signal-processing system comprising an analog-to-digital converter circuit, the first signal may, for example, comprise an analog signal that is to be converted to a digital signal by the analog-to-digital converter circuit. For example and without limitation, the signal-processing system may comprise a delta-sigma modulator configuration of an analog-to-digital circuit. In general, step 120 may comprise inputting a first signal to the signal-processing system. Accordingly, the scope of various aspects of the present invention should not be limited by characteristics of a particular first signal or signal-processing system architecture.

The method, at step 130, may comprise inputting a second signal to the signal-processing system. The second signal may, for example, comprise a digital signal. Such a digital signal may, for example, be input to the signal-processing system to control a behavior of the signal-processing system while the signal-processing system is processing the first signal, which was input to the signal-processing system at step 120.

In an exemplary signal-processing system comprising an analog-to-digital converter circuit, the second signal may, for example, comprise a digital dither signal (or other processing control signal), which may be input to the analog-to-digital converter circuit to disrupt tonal behavior of the analog-to-digital converter circuit. Such tonal behavior may, for example, result from a delta-sigma modulator processing a low frequency or low amplitude analog input signal.

In general, step 130 may comprise inputting a second signal to the signal-processing system. Accordingly, the scope of various aspects of the present invention should not be limited by characteristics of a particular second signal or signal-processing system architecture.

The method 100, at step 140, may comprise outputting an output signal from the signal-processing system. The output signal may comprise, for example, a first component that is primarily due to the signal-processing system processing the first input signal, and a second component that is primarily due to the signal-processing system processing the second input signal. It should be noted that in certain scenarios, various components of the output signal may not be cleanly separable (e.g., due to signal-processing non-linearities in the signal-processing system). In such instances, respective portions of the output signal may still be identifiable as being primarily due to the first input signal and/or the second input signal.

For example and without limitation, consider a scenario where the signal-processing system comprises an analog-to-digital converter circuit, the first input signal comprises an analog signal to be converted to a digital signal, and the second input signal comprises a digital dither signal (or other processing control signal). In the exemplary scenario, the analog-to-digital converter circuit may output an output signal that comprises a first component that is primarily due to the analog-to-digital converter circuit converting the analog input signal to a digital signal, and a second component that is primarily due to the analog-to-digital converter circuit processing the digital dither signal.

In general, step 140 may comprise outputting an output signal from the signal-processing system based on the first and second input signals. Accordingly, the scope of various aspects of the present invention should not be limited by characteristics of a particular output signal or components thereof.

The method 100, at step 150, may comprise estimating a portion (or component) of the output signal from the signal-processing system that is primarily due to the signal-processing system processing the second signal input to the signal-processing system. That is, a portion of the output signal from the signal-processing system may be primarily due to the signal-processing system processing the second input signal, which was input to the signal-processing system at step 130. Step 150 may comprise estimating such a portion of the output signal.

For example and without limitation, consider an exemplary scenario where the signal-processing system comprises an analog-to-digital converter circuit and the second input signal comprises a digital dither signal (or other processing control signal). The analog-to-digital converter circuit may, for example, output a digital output signal, a portion of which is primarily due to the analog-to-digital converter circuit processing the digital dither signal. In this example, step 150 may comprise estimating the portion of the signal output from the analog-to-digital converter circuit that is due to the analog-to-digital converter circuit processing the digital dither signal.

Estimating a portion of the output signal from the signal-processing system that is primarily due to the signal-processing system processing the second signal input to the signal-processing system may be performed in a variety of ways. For example, a transfer function that exactly or approximately characterizes the functional relationship between the second signal input to the signal-processing system and the signal output from the signal-processing system may be developed. Such a transfer function may, for example, be developed analytically or experimentally. Such a transfer function may also, for example, be adapted in real-time based on monitored behavior of the signal-processing system. Such a transfer function may, for example, be linear or non-linear, or analog or digital. Such a transfer function may, for example, comprise a digital approximation of analog system behavior. Accordingly, the scope of various aspects of the present invention should not be limited by characteristics of a particular transfer function of characteristics of determining such a transfer function.

Once a transfer function has been developed or determined, the portion of the output signal from the signal-processing system that is primarily due to the signal-processing system processing the second signal input to the signal-processing system may be estimated (or known) by applying the transfer function to the second signal input to the signal-processing system. In other words, once the output response of the signal-processing system to the second signal input is known, one may apply such a response to the second input signal to determine a portion of the output from the signal-processing system resulting from the second input signal.

In an exemplary scenario where the signal-processing system comprises an analog-to-digital converter circuit (e.g., a delta-sigma modulator circuit), and the second signal input to the signal-processing system comprises a digital dither signal (or other processing control signal), the transfer function may characterize the effect that a given digital dither signal will have on the output of the analog-to-digital converter. Accordingly, to estimate (or know) a component of the output signal from the analog-to-digital converter that is due to the analog-to-digital converter processing a known digital dither signal, the transfer function may be applied to the known digital dither signal.

In general, step 150 may comprise estimating a portion (or component) of the output signal from the signal-processing system that is primarily due to the signal-processing system processing the second signal input to the signal-processing system. Accordingly, the scope of various aspects of the present invention should not be limited by characteristics of a particular signal-processing system, particular second input signal, or particular way of estimating the portion of the output signal from the signal-processing system that is primarily due to the signal-processing system processing the second input signal.

The method 100, at step 160, may comprise removing the portion (or component) of the output signal estimated in step 150 from the output signal of the signal-processing circuit. That is, step 150 may have estimated the portion of the output signal from the signal-processing circuit that was primarily due to the second input signal. Step 160 comprises removing such an estimated portion of the output signal from the output signal.

Consider the exemplary signal-processing circuit configuration, where the signal-processing system comprises an analog-to-digital converter circuit, the first input signal comprises an analog signal that the analog-to-digital converter circuit is to convert to a digital signal, and the second input signal comprises a digital dither signal (e.g., input to the analog-to-digital converter circuit to disrupt tonal behavior). Step 150 may have, for example, estimated the portion of the output signal from the analog-to-digital converter circuit that was due to the analog-to-digital converter circuit processing the digital dither signal. Step 160 may then, for example, remove the estimated portion from the output signal, thereby substantially removing the effect of the digital dither signal on the signal output from the analog-to-digital converter circuit.

Step 160 may, for example, remove the estimated portion of the output signal from the output signal in a variety of ways, including analog or digital processing. For example, step 160 may utilize digital hardware subtracting circuitry to perform sample value modification. Also, for example, step 160 may utilize a processor executing software instructions. Additionally, for example, step 160 may utilize analog circuitry to effect such signal component removal.

In general, step 160 may comprise removing the portion (or component) of the output signal estimated in step 150 from the output signal of the signal-processing circuit. Accordingly, the scope of various aspects of the present invention should not be limited by characteristics of a particular method or apparatus for removing a signal component from a composite signal.

The method 100, at step 170, continues performing further functionality. For example, step 170 may lead to continued processing of the first and second inputs in accordance with steps 120–160. For example, step 170 may initiate performing steps to analyze the current behavior of the signal-processing circuit, and make adjustments to the steps 120–160 as needed. Accordingly, the scope of various aspects of the present invention should not be limited by characteristics of signal processing that occurs after performing various steps of the method 100.

Figure 2:
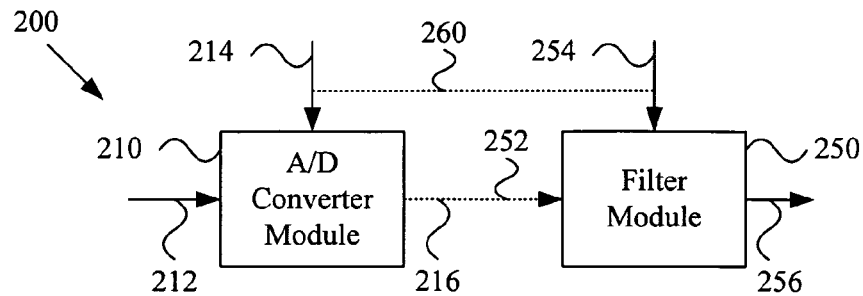
FIG. 2 is a diagram showing an analog-to-digital converter circuit implementing noise cancellation, in accordance with various aspects of the present invention.

FIG. 2 is a diagram showing an analog-to-digital converter circuit 200 implementing noise cancellation, in accordance with various aspects of the present invention. As mentioned previously, the analog-to-digital converter is utilized herein to provide particular illustrative examples of broader aspects of the present invention. Accordingly, the scope of various aspects of the present invention should not be limited by characteristics of an analog-to-digital converter.

The exemplary analog-to-digital converter circuit 200 comprises an A/D converter module 210 and a filter module 250. The A/D converter module 210 comprises an analog input 212, a digital dither input 214, and a digital output 216. The filter module 250 comprises a digital input 252, a digital dither input 254, and a digital output 256. The digital input 252 of the filter module 250 is communicatively coupled to the digital output 216 of the A/D converter module 210.

The A/D converter module 210 may, for example, receive an analog input signal at the analog input 212. The analog input signal may, for example, comprise an analog signal that the A/D converter module 210 is to convert to a digital signal. The A/D converter module 210 may, for example, comprise a delta-sigma modulator circuit for converting the analog input signal to a digital signal.

The A/D converter module 210 may, for example, receive a digital dither signal (or other processing control signal) at the digital dither input 214 of the A/D converter module 210. The digital dither signal may, for example, be introduced to disrupt tonal behavior of the A/D converter module 210. For example, as mentioned previously, the A/D converter module 210 may comprise a sigma-delta modulator circuit, which may exhibit tonal behavior under particular operating circumstances. Alternatively, for example, a digital signal received at the digital dither input 214 may control other processing aspects of the A/D converter module 210.

The A/D converter module 210 may, for example, output a digital output signal at the digital output 216 of the A/D converter module 210. Such a digital output signal may, for example, comprise a first signal component (or portion) based primarily on the analog input signal received at the analog input 212. The functional relationship between a signal input at the analog input 212 and output from the digital output 216 may, for example, be characterized by a signal transfer function. The digital output signal may also, for example, comprise a second signal component (or portion) based primarily on the digital dither signal input at the digital dither input 214. The functional relationship between a signal input at the digital dither input 214 and output from the digital output 216 may, for example, be characterized by a digital dither transfer function.

As mentioned previously, the digital input 252 of the filter module 250 may be communicatively coupled to the digital output 216 of the A/D converter module 210. Accordingly, the filter module 250 may, for example, receive the digital output signal from the digital output 216 of the A/D converter module 210. The received signal may, for example, comprise the first and second signal components discussed above.

The filter module 250 may, for example, receive a digital dither signal (or other processing control signal) at the digital dither input 254 of the filter module 250. The digital dither signal received at the digital dither input 254 may, for example, be based on the digital dither signal received at the digital dither input 214 of the A/D converter module 210. To this end, the digital dither input 254 of the filter module 250 may, for example, be communicatively coupled to the digital dither input 214 of the A/D converter module 210. The respective digital dither inputs 254, 214 may, for example, be conductively coupled.

The filter module 250 may, for example, output a digital signal at the digital output 256 of the filter module 250. Such a digital output signal may, for example, be based on respective signals received at the digital input 252 and digital dither input 254 of the filter module 250. For example, as mentioned previously, the filter module 250 may receive, at the digital input 252, the digital output signal from the digital output 216 of the A/D converter module 210. Also, as mentioned previously, the digital output signal from the digital output 216 of the A/D converter module 210 may comprise a first signal component, based primarily on the analog input to the A/D converter module 210, and a second signal component, based primarily on the digital dither input to the A/D converter module 210.

The filter module 250 may, for example, process the digital output signal from the A/D converter module 210 to substantially remove the second signal component of the digital output signal. The filter module 250 may then output a digital output signal reflective of the digital output signal received from the A/D converter module 210 with the second signal component substantially removed.

For example, the filter module 250 may determine or estimate the second signal component of the digital output signal. The filter module 250 may, for example, process the digital dither input with a transfer function indicative of the digital dither transfer function of the A/D converter module 210. Such a transfer function may, for example, be an exact duplicate of the digital dither transfer function of the A/D converter module 210. Alternatively, for example, such a transfer function may be substantially or approximately equivalent to the digital dither transfer function of the A/D converter module 210, or even in some instances, a rough approximation of the digital dither transfer function of the A/D converter module 210.

The filter module 250 may, for example, implement such determination or estimation with a first sub-module. The first sub-module may, for example, comprise digital hardware, software, analog hardware or hybrid circuitry to implement such a determination or estimation. Accordingly, the scope of various aspects of the present invention should not be limited by characteristics of particular methods or circuitry that may be utilized to determine or estimate a signal component.

Once the filter module 250 determines or estimates the second signal component of the digital input signal received from the A/D converter module 210, the filter module 250 may remove the second signal component from the digital input signal. The filter module 250 may, for example, utilize a second sub-module to perform such removal.

The second sub-module may perform such component removal using a variety of techniques and circuitry. For example and without limitation, the second sub-module may use digital signal subtraction circuitry to subtract the estimated or known second signal component from the digital input signal. The second sub-module may, for example, utilize digital, analog or hybrid circuitry to perform such component removal. Accordingly, the scope of various aspects of the present invention should not be limited by characteristics of a particular method or circuitry for removing a signal component from a signal.

It should be noted that the filter module 250 may be coupled with, or comprise components of, an additional filter. For example and without limitation, in an exemplary A/D converter scenario, the filter module 250 may be coupled with, or comprise components of, a decimation filter. Accordingly, the scope of various aspects of the present invention should not be limited by potential additional features or functionality of the exemplary filter module 250.

Figure 3:
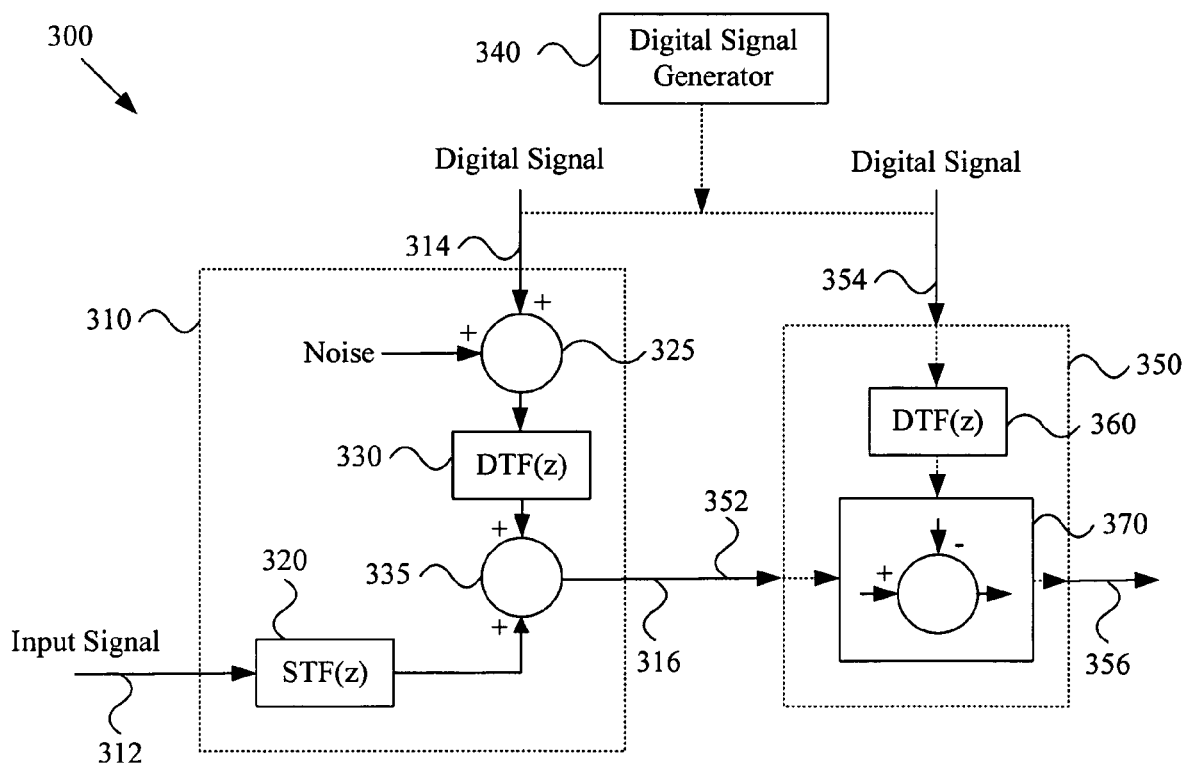
FIG. 3 is a diagram showing a signal-processing system implementing noise cancellation, in accordance with various aspects of the present invention.

FIG. 3 is a diagram showing a signal-processing system 300 implementing noise cancellation, in accordance with various aspects of the present invention. The exemplary system 300 may comprise a signal-processing module 310 and a filter module 350. The exemplary signal-processing module 310 may comprise a first input 312, a digital input 314 and an output 316. The exemplary filter module 350 may comprise a first input 352, a digital input 354 and an output 356. The first input 352 of the filter module 350 may, for example, be communicatively coupled to the output 316 of the signal-processing module 310.

The exemplary signal-processing module 310 may, for example, receive an input signal at the first input 312. Such an input signal may be analog or digital. The signal-processing module 310 may process the input signal. Such processing may, for example, be characterized by a signal transfer function 320.

The signal-processing module 310 may comprise any of a variety of signal-processing entities. For example and without limitation, the signal-processing module 310 may comprise an analog-to-digital converter (e.g., an A/D converter based on a delta-sigma modulator circuit configuration). In such an exemplary scenario, the signal-processing module 310 may receive an analog input signal at the first input 312, process the analog input signal according to the signal transfer function 320 (comprising aspects of an analog-to-digital converter transfer function), and output the processed signal at the output 316. The signal-processing module 310 may, for example, comprise a variety of analog and digital processing modules. Accordingly, the scope of various aspects of the present invention should not be limited by characteristics of particular circuit configurations or signal-processing techniques.

The signal-processing module 310 may output the processed signal at the output 316. A signal output by the signal-processing module 310 at the output 316 may comprise a combination of a plurality of signals. For example and without limitation, the summing node 335 shown in the diagram of the signal-processing module 310 illustrates that the signal output from the signal-processing module 310 at the output 316 may comprise a signal component corresponding to the input signal processed according to the signal transfer function 320 in addition to other signal components.

The signal-processing module 310 may, for example, receive a digital input signal (e.g., a digital dither signal or other processing control signal) at the digital input 314. The signal-processing module 310 may, for example, utilize such a digital input signal to control processing aspects of the signal-processing module 310. For example and without limitation, the digital input signal may comprise a digital dither signal that may, when processed by the signal-processing module 310, disrupt tonal behavior of the signal-processing module 310.

The exemplary system 300 illustrated in FIG. 3 comprises a digital signal generator module 340. An output of the digital signal generator module 340 may, for example, be communicatively coupled to the digital input 314 of the signal-processing module 310. The digital signal generator module 340 may, for example, generate a digital processor control signal that, when processed by the signal-processing module 310, controls signal-processing behavior of the signal-processing module 310. As an example, the generated digital processor control signal (e.g. a digital dither signal), when processed by the signal-processing module 310, may result in reduced noise (e.g., tonal noise) in the signal-processing module 310. In general, the digital signal generator module 340 may generate any of a large variety of digital processor control signals. Accordingly, the scope of various aspects of the present invention should not be limited by characteristics of a particular digital processor control signal.

The signal-processing module 310 may, for example, process the digital input signal received at the digital input 314. Such processing may, for example, be characterized by a digital transfer function 330. The signal-processing module 310 may, for example, process the digital input signal according to the digital transfer function 330, and output a resulting signal at the output 316. As discussed previously, a signal output at the output 316 of the signal-processing module 310 may comprise a plurality of signal components. As an example, an output signal may comprise a first signal component resulting from the signal-processing module 310 processing a signal received at the first input 312 according to the signal transfer function 320, and a second signal component resulting from the signal-processing module 310 processing a signal received at the digital input 314 according to the digital transfer function 330.

Additionally, the summing node 325, shown in the exemplary signal-processing module 310, illustrates that the signal-processing system 300 may have internal sources of noise. Such noise may, of course, be added to signals at various points in the signal-processing system 300. Accordingly the signal output by the signal-processing module 310 at the output 316 may also comprise a noise component due to any of a large variety of noise sources within and without the signal-processing module 310.

As mentioned previously, the output 316 of the signal-processing module 310 may be communicatively coupled to the first input 352 of the filter module 350. That is, the filter module 350 may receive the output signal from the signal-processing module 310, which may comprise a plurality of signal components. One of such components may be due to the signal-processing module 310 processing the digital input signal according to the digital transfer function 330.

The filter module 350 may also receive a digital input signal at the digital input 354 of the filter module 350. Such a digital input signal may, for example, be based on the digital input signal input provided to the signal-processing module 310. The digital input signal received at the digital input 354 of the filter module 350 may comprise, for example, a signal based on a signal-processing control signal (e.g., a digital dither signal) provided to the digital input 314 of the signal-processing module 310.

The digital input 354 of the filter module 350 may, for example, be communicatively coupled to the digital signal generator module 340 discussed previously. The digital input 354 of the filter module 350 may, for example, be communicatively and/or conductively coupled to the digital input 314 of the signal-processing module 310.

The filter module 350 may, for example, comprise a first sub-module 360 having an input and an output. The input of the first sub-module 360 may, for example, be communicatively coupled to the digital input 354 of the filter module 350. Accordingly, in an exemplary scenario where the digital input 354 of the filter module 350 is communicatively coupled to the digital input 314 of the signal-processing module 310, the input of the first sub-module 360 may receive the same digital input signal that is applied to the digital input 314 of the signal-processing module 310.

The first sub-module 360 may, for example, process the digital input signal according to a digital transfer function. Such a digital transfer function may, for example, be based on the digital transfer function 330 of the signal-processing module 310. For example, the digital transfer function of the first sub-module 360 may be equal to or approximately equal to the digital transfer function 330 of the signal-processing module 310. Also, for example, the digital transfer function of the first sub-module 360 may be a rough approximation of the digital transfer function 330 of the signal-processing module 310. In general, the digital transfer function of the first sub-module 360 may be based on the digital transfer function 330 of the signal-processing module 310. Accordingly, the scope of various aspects of the present invention should not be limited by an exact relationship between the digital transfer function of the first sub-module 360 and the digital transfer function 330 of the signal-processing module 310.

In an exemplary scenario, the first sub-module 360 may receive the same digital input signal that is applied to the digital input 314 of the signal-processing module 310. In such an exemplary scenario, the first sub-module 360 may, for example, process the digital input signal according to a digital transfer function that is based on the digital transfer function of the signal-processing module 310. In such a scenario, the first sub-module 360 may generate a signal indicative of the signal component of the signal-processing module 310 output 316 that is due to the signal-processing module 310 processing the digital input signal.

The filter module 350 may, for example, comprise a second sub-module 370 comprising a first input, a second input and an output. The first input may, for example, be communicatively coupled to the first input of the filter module 350. The second input may, for example, be communicatively coupled to the output of the first sub-module 360.

The second sub-module 370 may, for example, output a signal that is based on a difference between a signal received at the first input and a signal received at the second input. The second sub-module 370 may perform such differencing functionality in a variety of ways, including, but not limited to, utilizing digital subtracting circuitry.

For example, the second sub-module 370 may receive, at the first input, the output signal from the signal-processing module 310, where such output signal may comprise a plurality of signal components. The second sub-module 370 may also receive, at the second input, the output signal from the first sub-module 360, which, as discussed above, may be indicative of a signal component of the output signal from the signal-processing module 310. Accordingly, the second sub-module 370 may process the respective input signals and output a signal indicative of the output signal from the signal-processing module 310 with the signal component removed.

The output of the second sub-module 370 may, for example, be communicatively coupled to the output 356 of the filter module 310.

Figure 4:
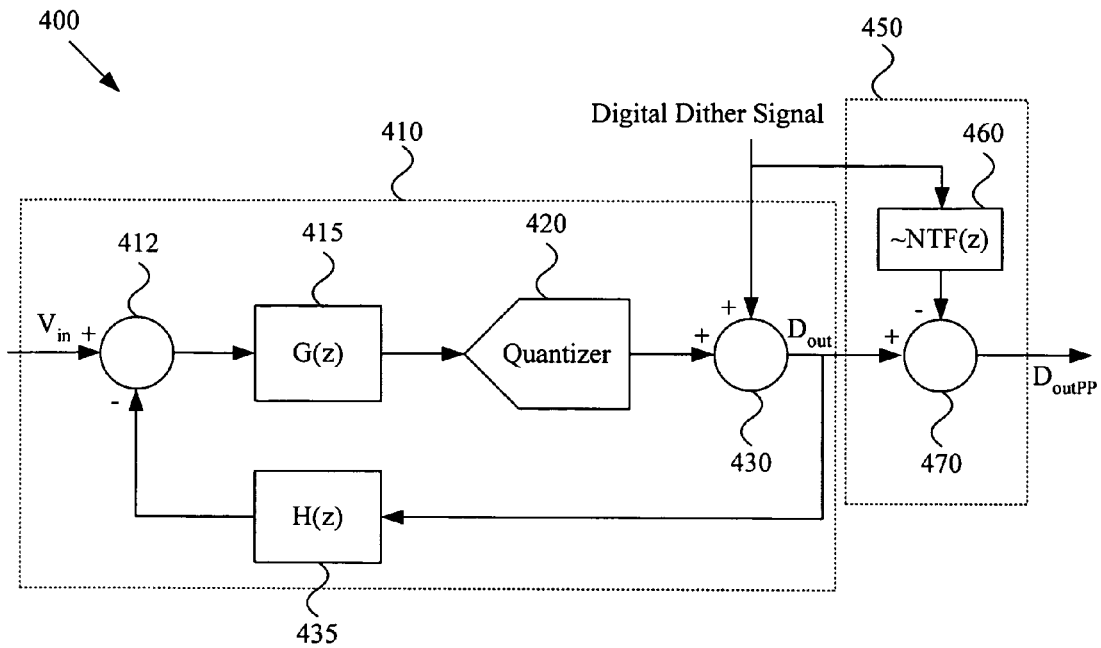
FIG. 4 is a diagram showing a first order analog-to-digital converter circuit implementing noise cancellation, in accordance with various aspects of the present invention.

FIG. 4 is a diagram showing a first order analog-to-digital converter circuit 400 implementing noise cancellation, in accordance with various aspects of the present invention. For example and without limitation, the first portion 410 of the exemplary circuit 400 may correspond to a specific example of one of many possible circuit configurations for the signal-processing module 310 illustrated in FIG. 3. Also, for example and without limitation, the second portion 450 of the exemplary circuit 400 may correspond to a specific example of one of many possible circuit configurations for the filter module 350 illustrated in FIG. 3. Accordingly, the scope of various aspects of the present invention should by no means be limited by aspects of the specific circuit 400 illustrated in FIG. 4.

The exemplary A/D converter circuit 400 receives an analog input signal $V_{in}$, at the positive input of a difference circuit 412. The difference circuit 412 receives, at its negative input, a feedback signal. An analog signal indicative of the difference between the analog input signal $V_{in}$ and the feedback signal is applied to a first functional block 415 having a transfer function G(z). The output of the first functional block 415 is input to a Quantizer 420, which converts the analog signal to discrete (or digital) form. The output of the Quantizer 420 is input to a summing circuit 430, which also receives a digital dither signal. The summing circuit 430 adds the output of the Quantizer 420 to the digital dither signal and outputs the signal $D_{out}$. The signal $D_{out}$ is applied to a second functional block 435 having a transfer function H(z). The output of the second functional block 435 represents the feedback signal discussed previously, which was input to the negative input of the difference circuit 412.

The transfer function characterizing the functional relationship between $V_{in}$, and $D_{out}$ is generally G(z)/(1+G(z)H(z)) and may be referred to as the signal transfer function (STF). The transfer function characterizing the functional relationship between the digital dither signal and $D_{out}$ is generally 1/(1+G(z)H(z)) and may be referred to herein as the noise transfer function (NTF). The output signal from the first portion 410 ($D_{out}$) includes a first signal component resulting from processing $V_{in}$ by the STF and a second component resulting from processing the digital dither signal by the NTF. Additionally, $D_{out}$ may comprise various other signal components (e.g., a signal component due to Quantizer noise).

The digital dither signal is input to a third functional block 460 having a transfer function ~NTF(z). As mentioned previously the noise transfer function NTF characterizes the functional relationship between the digital dither input and $D_{out}$. In the exemplary circuit 400, the third functional block 460 transfer function ~NTF(z) is at least an approximation to NTF, and perhaps exactly equal to NTF. Accordingly, the output of the third functional block 460 represents the component of $D_{out}$ that is primarily due to the A/D converter feedback loop operating on the digital dither input.

The output of the third functional block 460 is applied to the negative input of a difference circuit 470. $D_{out}$ is applied to the positive input of the difference circuit 470. Accordingly, the output of the difference circuit 470 is a signal indicative of $D_{out}$ with the signal component of $D_{out}$ due to the digital dither signal at least substantially removed.

Figure 5:
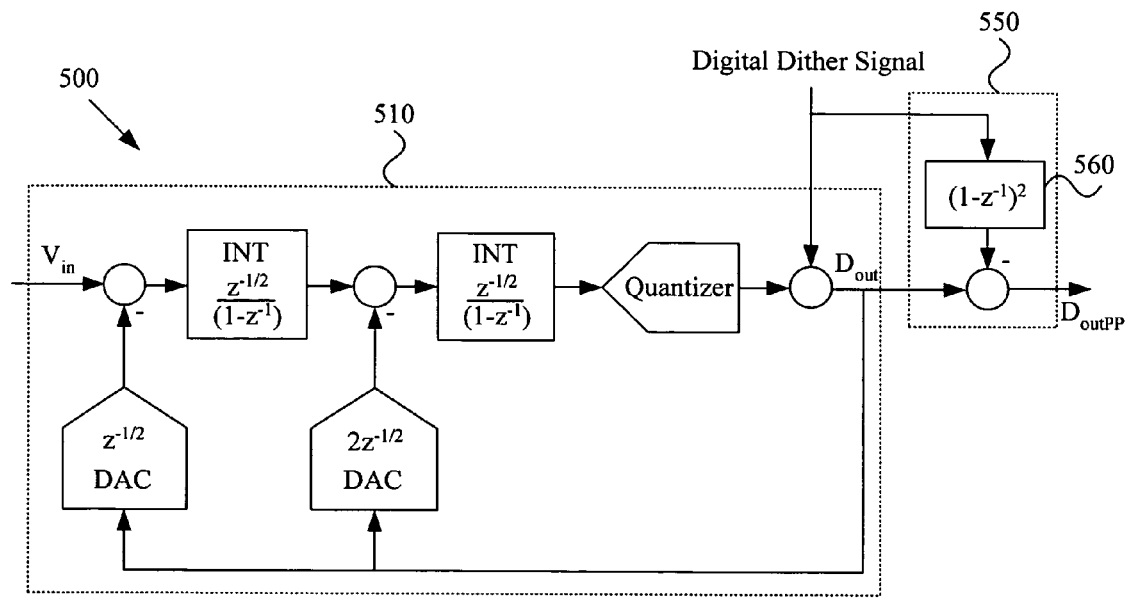
FIG. 5 is a diagram showing a second order analog-to-digital converter circuit implementing noise cancellation, in accordance with various aspects of the present invention.

FIG. 5 is a diagram showing a second order analog-to-digital converter circuit 500 implementing noise cancellation, in accordance with various aspects of the present invention. The circuit 500 comprises a second order sigma-delta analog-to-digital converter circuit configuration. For example and without limitation, the first portion 510 of the exemplary circuit 500 may correspond to a specific example of one of many possible circuit configurations for the signal-processing module 310 illustrated in FIG. 3. Also, for example and without limitation, the second portion 550 of the exemplary circuit 500 may correspond to a specific example of one of many possible circuit configurations for the filter module 350 illustrated in FIG. 3. Accordingly, the scope of various aspects of the present invention should by no means be limited to aspects of the specific circuit 500 illustrated in FIG. 5.

The exemplary A/D converter circuit 500, for the purpose of illustrating various aspects of the present invention, is generally similar to the A/D converter circuit 400 illustrated in FIG. 4. Various differences may comprise, for example, an NTF value in the third functional block 560 of $(1-z^{-1})$ or any other transfer function versus the illustrated NTF of $(1-z^{-1})^2$. This should, however, by no means limit the scope of various aspects of the present invention.

Additionally, the exemplary systems 300–500 illustrated in FIGS. 3–5 generally comprise components described in terms of discrete time transfer functions. This should by no means serve to limit the scope of various aspects of the present invention to characteristics of discrete time systems. For example, various modules or components may be continuous time or discrete time in nature.

Figure 6:
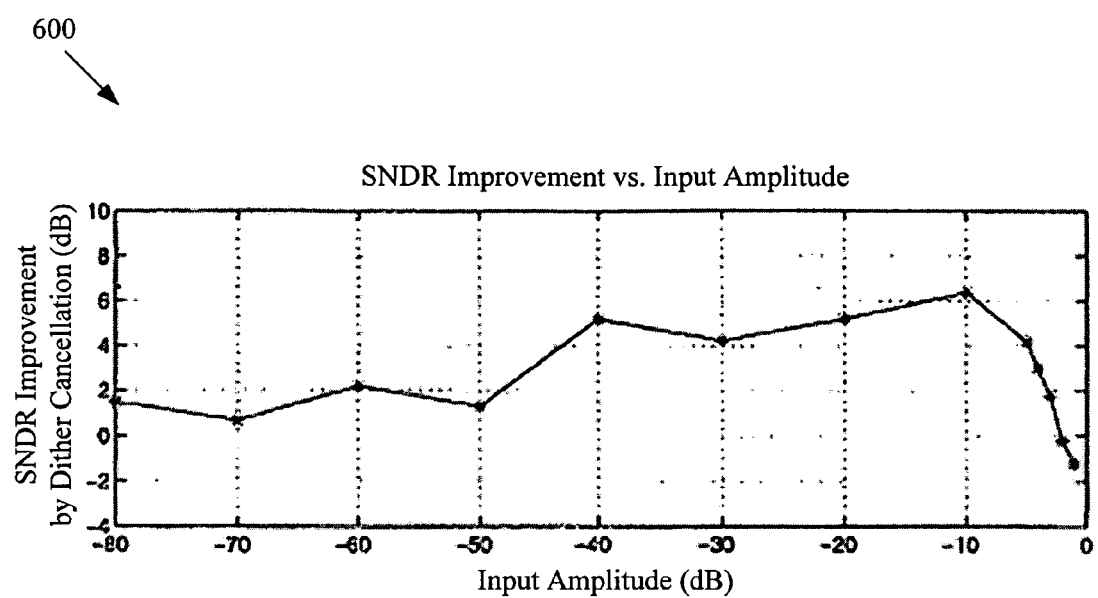
FIG. 6 is a plot illustrating an exemplary system performance increase from implementing noise cancellation in an analog-to-digital converter circuit, in accordance with various aspects of the present invention.

FIG. 6 is a graph 600 illustrating an exemplary system performance increase from implementing noise cancellation in an analog-to-digital converter circuit, in accordance with various aspects of the present invention. The graph 600 generally plots SNDR (signal to noise-and-distortion ratio) improvement on the vertical axis versus signal input amplitude on the horizontal axis. SNDR improvement was determined as the difference between the response of an analog-to-digital converter circuit utilizing a digital dither signal to disrupt tonal behavior, with and without utilizing various aspects of the present invention.

The graph 600 is presented herein as a specific example of general improvements that may result from utilizing various aspects of the present invention. Accordingly, the scope of various aspects of the present invention should not be limited by characteristics of the graph 600 or by characteristics of exemplary systems analyzed to obtain the data plotted in the graph 600.

The previous examples and illustrations present various exemplary system components and modules. Such components and modules may be implemented in a variety of ways, including but not limited to, hardware circuitry, a processor executing software instructions, analog circuitry, or various combinations thereof. For example, the various modules and components may be incorporated into a single integrated circuit. Accordingly, the scope of various aspects of the present invention should by no means be limited by characteristics of particular hardware or software implementations of the previously mentioned exemplary components and modules.

In summary, aspects of the present invention provide a system and method for noise cancellation in a signal-processing circuit (e.g., an analog-to-digital converter circuit). While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An analog-to-digital converter comprising:
  a first module comprising:
    an analog input that receives an analog signal;
    a digital dither input that receives a digital dither signal; and
    a digital output that outputs a digital output signal comprising a first component that is primarily a function of the analog signal, and a second component that is primarily a function of the digital dither signal;
    wherein the functional relationship between the digital dither input of the first module and the digital output of the first module is characterized by a digital dither transfer function; and
  a second module comprising:
    a digital input communicatively coupled to the digital output of the first module;
    a digital dither input that receives a signal indicative of the digital dither signal;
    a first sub-module comprising a digital dither input that receives the signal indicative of the digital dither signal and a digital output, wherein the functional relationship between the digital dither input of the first sub-module and the digital output of the first sub-module is characterized by a transfer function that is based on the digital dither transfer function of the first module; and
    a digital output that outputs a digital output signal reflective of the digital output signal from the first module with the second component substantially removed.

2. The analog-to-digital converter of claim 1, wherein the first module comprises a delta-sigma modulator.

3. The analog-to-digital converter of claim 1, wherein the digital dither input of the second module is communicatively coupled to the digital dither input of the first module.

4. The analog-to-digital converter of claim 1, wherein the first module comprises an A/D converter module, and the second module comprises a filter module.

5. The analog-to-digital converter of claim 1, wherein the transfer function of the first sub-module is substantially equal to the digital dither transfer function of the first module.

6. The analog-to-digital converter of claim 1, wherein the second module further comprises a second sub-module comprising:
  a first input communicatively coupled to the digital output of the first module;
  a second input communicatively coupled to the digital output of the first sub-module; and
  an output that outputs a signal based on the difference between the digital output of the first module and the digital output of the first sub-module.

7. A method for converting an analog signal to a digital signal, the method comprising:
  inputting an analog signal to an A/D circuit;
  inputting a digital signal to the A/D circuit;
  outputting a digital signal from the A/D circuit, wherein the digital signal output from the A/D circuit is a function of the analog signal input to the A/D circuit and the digital signal input to the A/D circuit;
  estimating a portion of the digital signal output from the A/D circuit that is due to the A/D circuit processing the digital signal input to the A/D circuit, wherein the estimating comprises determining a transfer function for the A/D circuit that characterizes the functional relationship between the digital signal input to the A/D circuit and the digital signal output from the A/D circuit, and applying the transfer function to the digital signal input to the A/D circuit; and
  removing the estimated portion from the digital signal output from the A/D circuit.

8. The method of claim 7, wherein the A/D circuit comprises a delta-sigma modulator.

9. The method of claim 7, wherein inputting a digital signal into the A/D circuit comprises inputting a digital dither signal into the A/D circuit.

10. A signal-processing circuit comprising:
  a signal-processing module comprising a first input, a digital input and and output, wherein:
    the signal-processing module outputs a signal that is a function of a signal input at the first input and a digital signal input at the digital input; and
    the functional relationship between the digital input and the output is characterized by a digital transfer function; and
  a filter module communicatively coupled to the signal-processing module, the filter module comprising:
    a first sub-module comprising a digital input and an output, wherein:
      the digital input is communicatively coupled to the digital input of the signal-processing module; and
      the functional relationship between the digital input and the output is characterized by a digital transfer function that is based on the digital transfer function of the signal-processing module; and
    a second sub-module comprising a first input, a second input and an output, wherein:
      the first input is communicatively coupled to the signal-processing module output;
      the second input is communicatively coupled to the first sub-module output; and
      the second sub-module outputs a signal that is a function of the difference between a signal received at the first input and a signal received at the second input.

11. The signal-processing circuit of claim 10, further comprising a digital signal generator module that comprises a digital output communicatively coupled to the signal-processing module digital input and the first sub-module digital input, wherein the digital signal generator module outputs a digital dither signal.

12. The signal-processing circuit of claim 10, further comprising a digital signal generator module that comprises a digital output communicatively coupled to the signal-processing module digital input and the first sub-module digital input, wherein the digital signal generator module outputs a digital signal designed to reduce tonal noise in the signal-processing module.

13. The signal-processing circuit of claim 10, further comprising a digital signal generator module that comprises a digital output communicatively coupled to the signal-processing module digital input and the first sub-module digital input, wherein the digital signal generator module outputs a digital dither signal.

14. The signal-processing circuit of claim 10, wherein the signal-processing module receives an analog signal at the first input of the signal-processing module and outputs a digital signal.

15. The signal-processing circuit of claim 10, wherein the signal-processing module comprises an analog-to-digital converter, the signal-processing module receives an analog input signal at the first input of the signal-processing module, and the signal-processing module outputs a signal comprising a digital representation of the analog input signal.

16. The signal-processing circuit of claim 10, wherein the digital transfer function of the first sub-module is substantially identical to the digital transfer function of the signal-processing module.

17. The signal-processing circuit of claim 10, wherein the digital transfer function of the first sub-module is an approximation of the digital transfer function of the signal-processing module.

18. The signal-processing circuit of claim 10, wherein the first module comprises a delta-sigma modulator circuit.

19. A signal-processing circuit comprising an analog-to-digital converter that generates a digital signal comprising a first component that is at least a function of an analog input signal and a second component that is at least a function of a digital input signal, said analog-to-digital converter outputs a digital output signal that is representative of the generated digital signal having the second component substantially removed wherein:

the analog-to-digital converter comprises a filter module that receives the generated digital signal and substantially removes the second component from the generated digital signal:

the filter module receives the digital input signal and estimates the second component of the generated digital signal based at least in part on the digital input signal; and the functional relationship between the digital input signal and the generated digital signal is characterized by a digital transfer function, and the filter module estimates the second component of the generated digital signal based at least in part on an estimation of the digital transfer function.

20. The signal-processing circuit of claim 19, wherein the second component is at least a function of a digital dither signal.

21. The signal-processing circuit of claim 19, wherein the analog-to-digital converter comprises a delta-sigma modulator circuit.

22. The signal-processing circuit of claim 19, wherein the estimation of the digital transfer function is substantially identical to the digital transfer function.

23. The signal-processing circuit of claim 19, wherein the estimation of the digital transfer function is identical to the digital transfer function.

24. A method for converting an analog signal to a digital signal, the method comprising:

inputting an analog signal to an A/D circuit;

inputting a digital signal to the A/D circuit;

outputting a digital signal from the A/D circuit, wherein the digital signal output from the A/D circuit is a function of the analog signal input to the A/D circuit and the digital signal input to the A/D circuit;

estimating a portion of the digital signal output from the A/D circuit that is due to the A/D circuit processing the digital signal input to the A/D circuit, wherein the estimating comprises estimating a digital transfer function for the A/D circuit that approximately characterizes the functional relationship between the digital signal input to the A/D circuit and the digital signal output from the A/D circuit, and applying the estimated digital transfer function to the digital signal input to the A/D circuit; and removing the estimated portion from the digital signal output from the A/D circuit.

25. The method of claim 24, wherein the A/D circuit comprises a delta-sigma modulator.

26. The method of claim 24, wherein inputting a digital signal into the A/D circuit comprises inputting a digital dither signal into the A/D circuit.

* * * * *